(12) United States Patent
Lee et al.

(10) Patent No.: US 7,495,991 B2
(45) Date of Patent: Feb. 24, 2009

(54) MEMORY CHIP ARCHITECTURE WITH HIGH SPEED OPERATION

(75) Inventors: Geun-Il Lee, Kyoungki-do (KR); Yong-Suk Joo, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/999,465

(22) Filed: Dec. 4, 2007

(65) Prior Publication Data

US 2008/0089107 A1 Apr. 17, 2008

Related U.S. Application Data

(62) Division of application No. 11/323,386, filed on Dec. 29, 2005, now Pat. No. 7,310,258.

(30) Foreign Application Priority Data

Mar. 31, 2005 (KR) .................... 10-2005-0027401

(51) Int. Cl.
 *G11C 8/00* (2006.01)
(52) U.S. Cl. ............... 365/230.03; 365/63; 365/189.03; 365/189.18; 365/189.08
(58) Field of Classification Search ............ 365/230.01, 365/230.03, 63, 189.03, 189.18, 189.08
See application file for complete search history.

(56) References Cited

U.S. PATENT DOCUMENTS

| 5,880,987 | A | * | 3/1999 | Merritt | ..................... | 365/51 |
|---|---|---|---|---|---|---|
| 6,041,013 | A | * | 3/2000 | Kohno | .................. | 365/230.03 |
| 6,097,640 | A | * | 8/2000 | Fei et al. | ............... | 365/189.02 |
| 6,151,264 | A | | 11/2000 | Yoo | | |
| 6,314,042 | B1 | * | 11/2001 | Tomishima et al. | .... | 365/230.03 |
| 6,331,955 | B1 | * | 12/2001 | Shin et al. | ............. | 365/189.05 |
| 6,351,404 | B1 | * | 2/2002 | Wright et al. | ................ | 365/51 |
| 6,353,549 | B1 | * | 3/2002 | Merritt | ..................... | 365/51 |
| 6,385,100 | B2 | * | 5/2002 | Noda et al. | ............ | 365/189.12 |
| 6,396,766 | B1 | | 5/2002 | Lee | | |
| 6,473,358 | B2 | * | 10/2002 | Noda et al. | ............ | 365/230.06 |
| 6,473,360 | B2 | * | 10/2002 | Ooishi | ........................ | 365/233 |
| 6,512,719 | B2 | * | 1/2003 | Fujisawa et al. | ............ | 365/233 |
| 6,541,849 | B1 | * | 4/2003 | Roohparvar | ................ | 257/691 |
| 6,569,727 | B1 | * | 5/2003 | Casper et al. | ............... | 438/210 |

(Continued)

FOREIGN PATENT DOCUMENTS

JP 2002-21177 1/2000

(Continued)

*Primary Examiner*—Viet Q Nguyen
(74) *Attorney, Agent, or Firm*—Blakely, Sokoloff, Taylor & Zafman LLP

(57) ABSTRACT

A semiconductor memory device includes at least one data transmission block including data I/O pads arranged in a major-axis side of the semiconductor memory device; a command and address transmission block including address and command input pads arranged in at least one minor-axis side of the semiconductor memory device; a global line block, arranged in a center of the semiconductor memory device, for transmitting inputted command and address; and at least one bank area, arranged between the global line block and the data transmission block, each bank area containing plural data I/O blocks located in a side of the data transmission block and plural control blocks located in a side of the global line block.

10 Claims, 7 Drawing Sheets

U.S. PATENT DOCUMENTS

| | | | | |
|---|---|---|---|---|
| 6,668,345 | B1 * | 12/2003 | Ooishi et al. | 714/710 |
| 6,873,563 | B2 * | 3/2005 | Suwa et al. | 365/230.03 |
| 6,891,772 | B2 * | 5/2005 | Demone | 365/230.04 |
| 6,898,110 | B2 * | 5/2005 | Ishimatsu et al. | 365/149 |
| 6,949,813 | B2 * | 9/2005 | Roohparvar | 257/666 |
| 6,996,027 | B2 * | 2/2006 | Shin | 365/185.17 |
| 7,016,255 | B2 * | 3/2006 | Lee et al. | 365/230.05 |
| 7,042,791 | B2 * | 5/2006 | Park | 365/230.05 |
| 7,061,941 | B1 * | 6/2006 | Zheng | 370/535 |
| 7,110,321 | B1 * | 9/2006 | Gibson | 365/189.02 |
| 7,123,497 | B2 * | 10/2006 | Matsui et al. | 365/63 |
| 7,200,067 | B2 * | 4/2007 | Ahn et al. | 365/230.03 |
| 7,310,258 | B2 * | 12/2007 | Lee et al. | 365/63 |
| 2005/0141255 | A1 | 6/2005 | Ko et al. | |

FOREIGN PATENT DOCUMENTS

| | | |
|---|---|---|
| JP | 2000-149549 | 5/2000 |
| JP | 2003-100073 | 4/2003 |
| KR | 2000-0062116 | 10/2000 |
| KR | 2002-0061872 | 7/2002 |
| KR | 2003-0001870 | 1/2003 |
| KR | 2004-0022905 | 3/2004 |

* cited by examiner

| Data(X16)_T | | | | | | | |
|---|---|---|---|---|---|---|---|
| I/O-S/A & WDRV | | I/O-S/A & WDRV | | | I/O-S/A & WDRV | | |
| Bank0 _T DQ31~24,15~18 16M | X_dec | X_dec | Bank1 _T DQ31~24,15~18 16M | Bank2 _T DQ31~24,15~18 16M | X_dec | X_dec | Bank3 _T DQ31~24,15~18 16M |
| Y_dec | | | Y_dec | Y_dec | | | Y_dec |
| Global | | | | | | | |
| Y_dec | | | Y_dec | Y_dec | | | Y_dec |
| Bank0 _B DQ31~24,15~18 16M | X_dec | X_dec | Bank1 _B DQ31~24,15~18 16M | Bank2 _B DQ31~24,15~18 16M | X_dec | X_dec | Bank3 _B DQ31~24,15~18 16M |
| I/O-S/A & WDRV | | I/O-S/A & WDRV | | | I/O-S/A & WDRV | | |
| Data(X16)_B | | | | | | | |

Com&Add

MEMORY CHIP ARCHITECTURE WITH HIGH SPEED OPERATION

The present patent application is a Divisional of application Ser. No. 11/323,386, filed Dec. 29, 2005, now U.S. Pat. No. 7,310,258.

FIELD OF THE INVENTION

An embodiment of the invention relates to a semiconductor memory device; and, more particularly, to a chip architecture of the semiconductor memory device.

DESCRIPTION OF RELATED ARTS

Generally, a memory device such as a dynamic random access memory (DRAM) is used in a computer and a communication device. Moreover, there is a need to operate the memory device at higher frequencies; thus, the memory device is fabricated for stable high-speed operation. In addition, for reducing fabrication cost of the memory device, there is a need to minimize a die size of the memory device.

Conventionally, a semiconductor memory device includes a plurality of banks, each for performing a data access independently. Each bank includes a row decoder (X-decoder), a column decoder (Y-decoder), an I/O sense amplifier, a write driver, an address control block, and other functional blocks for supporting the data access. The semiconductor memory device performs the data access between a unit cell of each bank and a data I/O pad by operating the above mentioned functional blocks included in each bank.

FIG. 1 is a block diagram showing a chip architecture of a conventional graphic double data rate synchronous dynamic random access memory (hereinafter, referred as a conventional graphic DDR SDRAM). Herein, the conventional graphic DDR SDRAM has an X32 data width.

As shown, the conventional graphic DDR SDRAM includes four unit blocks arranged on the same plane in length and breadth. Each unit block having four banks is coupled to an X8 data I/O transmission block including an X8 data I/O pad.

In detail, each of the above four unit blocks is respectively located in one of four quadrants where a center of the semiconductor memory device is considered as an origin. Each unit block is constituted with four banks.

Each unit block includes a first bank Bank0, a second bank Bank1, a third bank Bank2 and a fourth bank Bank3. Herein, the first bank Bank0 and the third bank Bank2 are arranged near the X8 data I/O transmission block, and the second bank Bank1 and the fourth bank Bank2 are arranged near a global I/O block located in a center of the conventional graphic DDR SDRAM. Also, each bank is capable of storing 16M byte data or 8M byte data.

Further, an I/O sense amplifier I/O-S/A, a write driver WDRV, a column decoder Y-dec for performing the data access in each of the first and second banks Bank0 and Bank1 are arranged between the first and second banks Bank0 and Bank1. That is, each two of the I/O sense amplifiers I/O-S/As, the write drivers WDRVs, the column decoders Y-decs are arranged between the first and second banks Bank0 and Bank1. Likewise, the I/O sense amplifiers I/O-S/As, the write drivers WDRVs and the column decoders Y-decs corresponding to the third and fourth banks Bank2 and Bank3 are arranged between the third and fourth banks Bank2 and Bank3.

Meanwhile, row decoders X-decs for performing the data access in the first and third banks Bank0 and Bank2 are arranged between the first and third banks Bank0 and Bank2; likewise, row decoders X-decs for performing the data access in the second and fourth banks Bank1 and Bank3 are arranged between the second and fourth banks Bank1 and Bank3.

A command and address transmission block Com&Add including address input pads and command input pads is arranged in a minor-axis side of the conventional graphic DDR SDRAM. The command and address transmission block Com&Add transfers inputted command and address to data access control block X,Y_ctrl via the global I/O block located in the center of the conventional graphic DDR SDRAM. Herein, the command and address transmission block Com&Add located in a center of each unit block is for controlling the row decoder and the column decoder corresponding to each bank.

In above described architecture of the conventional graphic DDR SDRAM, a global I/O line can become shorter because the I/O sense amplifier I/O-S/A and the write driver WDRV for transmitting data are coupled to eight neighboring data I/O pads. Thus, since a flight time for transmitting data inputted in or outputted from each bank via the global data line is reduced, the conventional graphic DDR SDRAM can operate faster, i.e., in a high-frequency condition. Particularly, an address access time tAA which is one of critical factors for evaluating a performance of the conventional graphic DDR SDRAM is improved.

However, as above described, the unit block constituted with four banks should include each four of the I/O sense amplifiers I/O-S/As, the write drivers WDRVs, the column decoders Y-decs, the row decoders X-decs and the data access control blocks X,Y_ctrls; thus, current consumption for performing the data access is increased and an operation speed of the conventional graphic DDR SDRAM becomes slow. Also, because of the I/O sense amplifiers I/O-S/As, the write drivers WDRVs, the column decoders Y-decs, the row decoders X-decs and the data access control blocks X,Y_ctrls, the conventional graphic DDR SDRAM cannot reduce a die size; as a result, a characteristic for mass production is still bad.

Therefore, a chip architecture for implementing a semiconductor memory device for stably operating in high-speed and improving the characteristic for mass production is needed.

SUMMARY OF THE INVENTION

An embodiment of the invention is a semiconductor memory device having a chip architecture for reducing a chip size to thereby increase the number of die per wafer in order to improve a characteristic of mass production.

An embodiment of the invention is a semiconductor memory device with a reduction in an amount of current consumed by control blocks for performing a data access to achieve a high-speed operation.

An embodiment of the invention is a semiconductor memory device that may allow for fast developing a cutdown product having a substantially identical characteristic and a different cell density by arranging control blocks for performing a data access in order to achieve a simple modification.

An embodiment of the invention is a semiconductor memory device that may substantially equalize an access timing of each bank in response to inputted command and address by using a transmission control block between each bank and control and address pads.

In accordance with an aspect of the present invention, there is provided a semiconductor memory device for increasing an integration to improve an operation speed and a power consumption of the semiconductor memory device, including at least one data transmission block including data I/O pads arranged in a major-axis side of the semiconductor memory device; a command and address transmission block including address and command input pads arranged in at least one minor-axis side of the semiconductor memory device; a global line block, arranged in a center of the semiconductor memory device, for transmitting inputted command and address; and at least one bank area, arranged between the global line block and the data transmission block, each bank area containing plural data I/O blocks located in a side of the data transmission block and plural control blocks located in a side of the global line block to thereby minimize paths for transmitting a data, a command and an address for increasing the integration.

In accordance with another aspect of the present invention, there is provided a semiconductor memory device for increasing an integration, including a top bank area having a plurality of top banks, the top bank area arranged in a top side of a virtual bisector, wherein the virtual bisector divides chip's minor-axis of the semiconductor memory device by two parts; a bottom bank area having a plurality of bottom banks, the bottom bank area arranged in a bottom side of the virtual bisector; a plurality of first data I/O pads arranged in a top margin of the top bank area; a plurality of second data I/O pads arranged in a bottom margin of the bottom bank area; and a control line block, arranged between the top bank area and the bottom bank area in a direction of the virtual bisector, for transmitting inputted command and address, wherein a half data corresponding to the inputted command and address are outputted through the plurality of first data I/O pads and another half data corresponding to the inputted command and address are outputted through the plurality of second I/O pads.

BRIEF DESCRIPTION OF THE DRAWINGS

The above features will become better understood with respect to the following description of the specific embodiments given in conjunction with the accompanying drawings, in which:

FIG. 1 is a block diagram showing a chip architecture of a conventional graphic double data rate synchronous dynamic random access memory;

FIG. 4 is a block diagram showing a chip architecture of a DDR SDRAM in accordance with another embodiment of the present invention;

DETAILED DESCRIPTION OF THE INVENTION

Hereinafter, a memory device in accordance with specific embodiments of the present invention will be described in detail with reference to the accompanying drawings.

A semiconductor memory device according to the present invention increases an integration to improve operation speed and power consumption of the semiconductor memory device. The semiconductor memory device includes at least one data transmission block including data I/O pads arranged in a major-axis side of the semiconductor memory device; a command and address transmission block including address and command input pads arranged in at least one minor-axis side of the semiconductor memory device; a global line block, arranged in a center of the semiconductor memory device, for transmitting inputted command and address; and at least one bank area, arranged between the global line block and the data transmission block, each bank area containing plural data I/O blocks located in a side of the data transmission block and plural control blocks located in a side of the global line block to thereby minimize paths for transmitting a data, a command and an address for increasing the integration.

Figure 2:
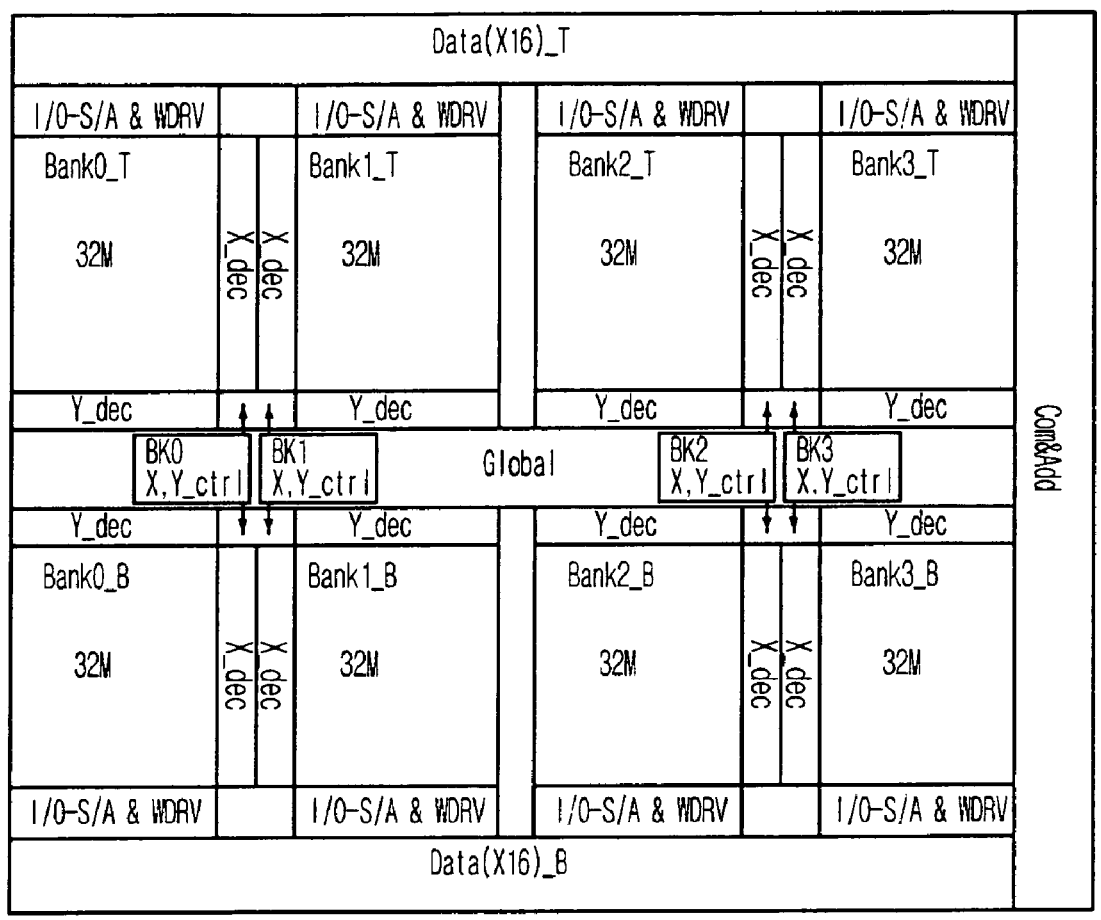
FIG. 2 is a block diagram showing a chip architecture of a double data rate synchronous dynamic random access memory (DDR SDRAM) in accordance with an embodiment of the present invention.

FIG. 2 is a block diagram showing a chip architecture of a double data rate synchronous dynamic random access memory (hereinafter, referred as a DDR SDRAM) in accordance with an embodiment of the present invention. Herein, a graphic DDR SDRAM capable of storing 8 M byte and having an X32 data width is described as the DDR SDRAM.

As shown, a chip of the DDR SDRAM is split into four parts in a direction of a major axis and also split into two parts in a direction of a minor axis; as a result, the DDR SDRAM includes eight banks arranged in a form of 4×2 matrix.

First to fourth banks Bank0_T, Bank1_T, Bank2_T and Bank3_T among the eight banks are located in a top area of said two parts separated by a virtual bisector dividing chip's minor-axis of the semiconductor memory device. Each of the first to fourth banks Bank0_T, Bank1_T, Bank2_T and Bank3_T receives or outputs data through a plurality of first data I/O pads Data(X)_T arranged in a top margin of the top area.

Other banks, i.e., fifth to eighth banks Bank0_B, Bank1_B, Bank2_B and Bank3_B, among the eight banks are located in a bottom area of said two parts separated by a virtual bisector dividing chip's minor-axis of the semiconductor memory device. Data is inputted in or outputted from each of the fifth to eighth banks Bank0_B, Bank1_B, Bank2_B and Bank3_B through a plurality of second data I/O pads Data(X)_B arranged in a bottom margin of the bottom area.

In detail, in the top area, each I/O sense amplifier I/O-S/A and each write driver WDRV corresponding to each of the first to fourth banks Bank0_T, Bank1_T, Bank2_T and Bank3_T are arranged between each of the first to fourth banks Bank0_T, Bank1_T, Bank2_T and Bank3_T and the plurality of first data I/O pads Data(X)_T.

Also, column decoders Y-Decs corresponding to each of the first to fourth banks Bank0_T, Bank1_T, Bank2_T and Bank3_T are arranged between each of the first to fourth banks Bank0_T, Bank1_T, Bank2_T and Bank3_T and a global area Global.

Row decoders X-Decs corresponding to the first bank Bank0_T and the second bank Bank1_T are arranged between the first bank Bank0_T and the second bank Bank1_T. Likewise, row decoders X-Decs corresponding to the third bank Bank2_T and the fourth bank Bank3_T are arranged between the third bank Bank2_T and the fourth bank Bank3_T.

As above described, the bottom area is similar to the top area in a view of structure. In detail, each I/O sense amplifier and each write driver corresponding to each of the fifth to eighth banks Bank0_B, Bank1_B, Bank2_B and Bank3_B are arranged between each of the fifth to eighth banks Bank0_B, Bank1_B, Bank2_B and Bank3_B and the plurality of second data I/O pads Data(X)_B. Also, column decoders Y-Decs corresponding to each of the fifth to eighth banks Bank0_B, Bank1_B, Bank2_B and Bank3_B are located between each of the fifth to eighth banks Bank0_B, Bank1_B, Bank2_B and Bank3_B and the global area Global. Two row decoders X-Decs corresponding to the fifth bank Bank0_B and the sixth bank Bank1_B are arranged between the fifth bank Bank0_B and the sixth bank Bank1_B. Likewise, another two row decoders X-Decs corresponding to the seventh bank Bank2_B and the eighth bank Bank3_B are arranged between the seventh bank Bank2_B and the eighth bank Bank3_B.

The DDR DRAM further includes a plurality of command and address pads Com&Add for transmitting the inputted address and command to decoding control blocks X,Y_ctrl coupled to each bank. The plurality of command and address pads Com&Add are arranged in a minor-axis side of the chip. Herein, the DDR DRAM includes four decoding control blocks BK0X,Y_ctrl to BK3X,Y_ctrl, each for controlling two column decoders and two row decoders corresponding to two banks, i.e., one bank in the top area and the other bank in the bottom area. For example, a first decoding control block BK0X,Y_ctrl controls two column decoders and two row decoders respectively corresponding to the first bank Bank0_T and the fifth bank Bank0_B.

Figure 1:
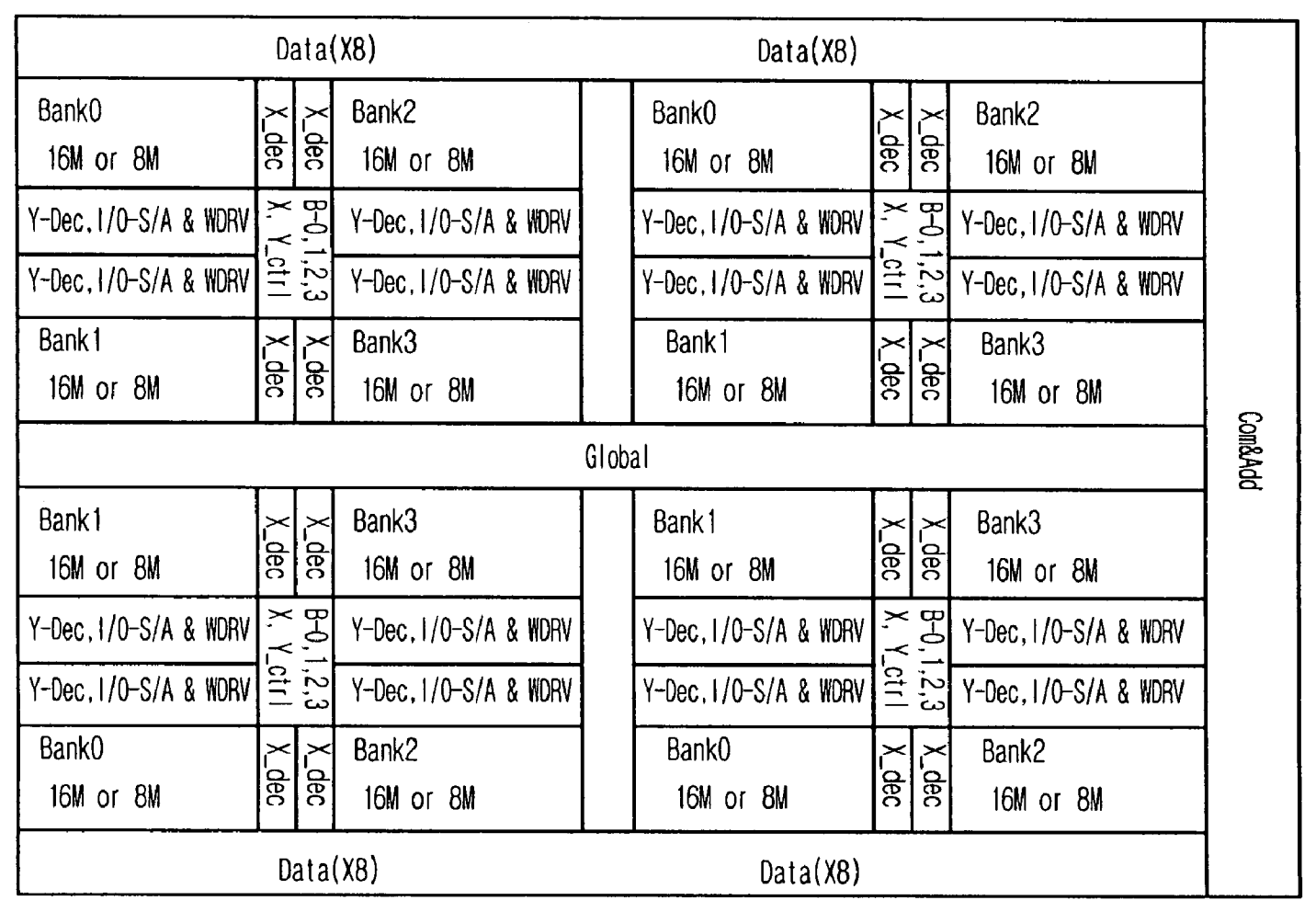

As described above, in a DDR SDRAM according to an embodiment of the present invention, the top area and the bottom area, each including four banks, are respectively coupled to 16 data I/O pads. Because of above described scheme, the DDR SDRAM has smaller die size than the conventional graphic DDR SDRAM shown in FIG. 1. Further, as compared with the conventional graphic DDR SDRAM, each eight of I/O sense amplifiers I/O-S/As, write drivers WDRVs and column decoders Y-Dec are not required; and twelve decoding control blocks X,Y_ctrl are also not required. Thus, a DDR SDRAM according to an embodiment of the present invention improves a characteristic of mass production by reducing a chip size.

Moreover, from the point of view of operation speed, the amount of current consumed in functional blocks for performing a data access can be reduced; thus, the DDR SDRAM has an advantage for operating in high speed. In addition, since the column decoder Y_Dec is arranged in a region close to the plurality of command and address pads Com&Add, a column control signal is activated as fast as possible; thus, an address access time tAA is improved. Likewise, since each I/O sense amplifier I/O-S/A and each write driver WDRV are arranged in regions close to the first and second data I/O pads Data(X)_T and Data(X)_B, a data access time, i.e., a time for performing data input/output is improved.

Figure 3:
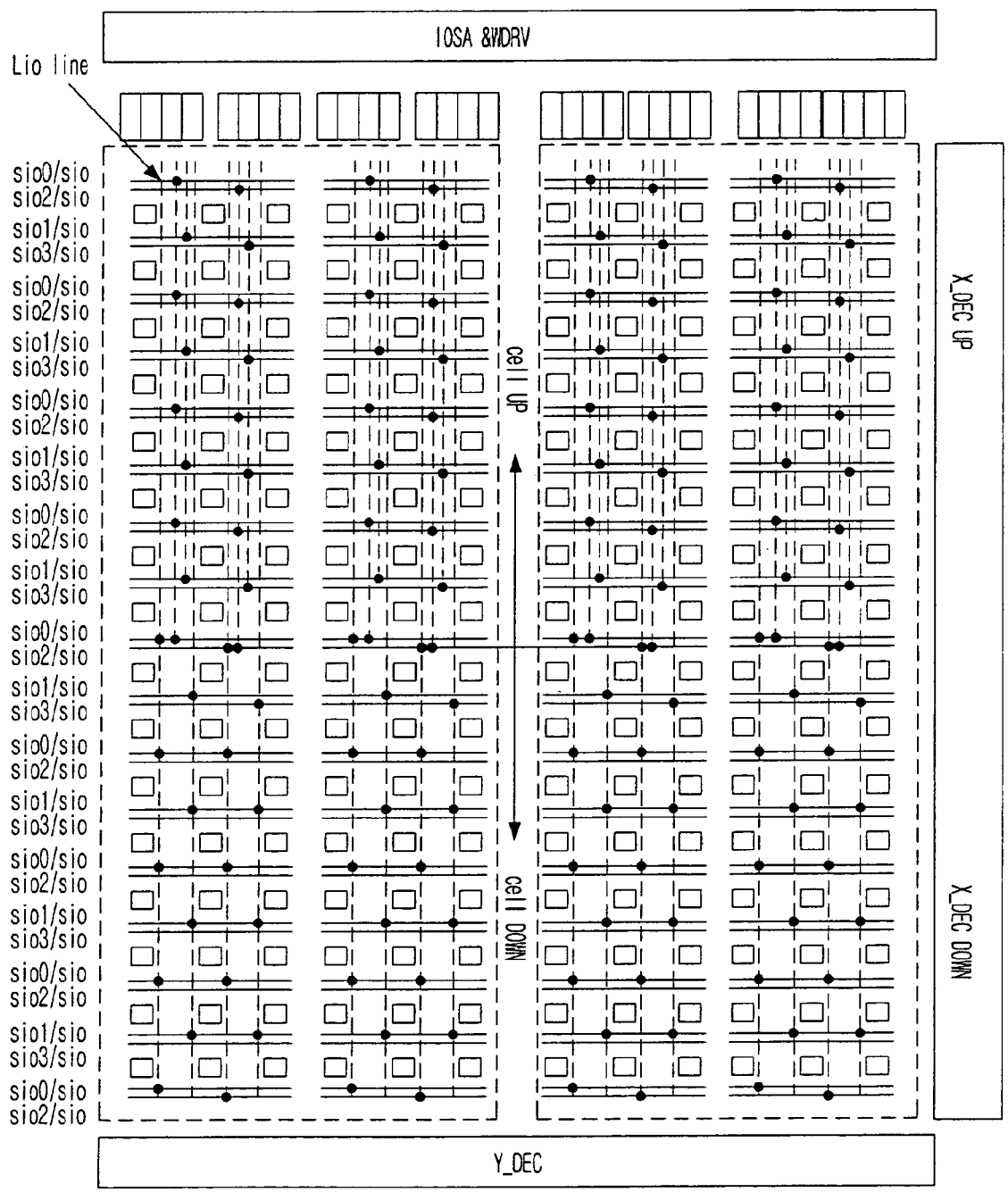
FIG. 3 is a block diagram describing a structure of each bank shown in FIG. 2.

FIG. 3 is a block diagram describing a structure of each bank shown in FIG. 2.

As shown, a memory cell array in the bank can be split into a cell up block and a cell down block, the cell up block and the cell down block respectively including row decoders X-DEC_UP and X-DEC_DOWN.

When a row address is inputted to perform the data access, two wordlines, each included in the cell up block and the cell down block, are simultaneously activated. Herein, eight local I/O lines Lio-line is coupled between the cell up block and the I/O sense amplifier/write driver IOSA&WDRV; and other eight local I/O lines Lio-line is coupled to between the cell down block and the I/O sense amplifier/write driver IOSA&WDRV. That is, when the row address is inputted, 16 cell data including eight cell data outputted from the cell up block and eight data outputted from the cell down block are outputted. The memory cell array further includes a plurality of segment I/O lines sio for transmitting data from a unit cell to the local I/O line.

Figure 5:
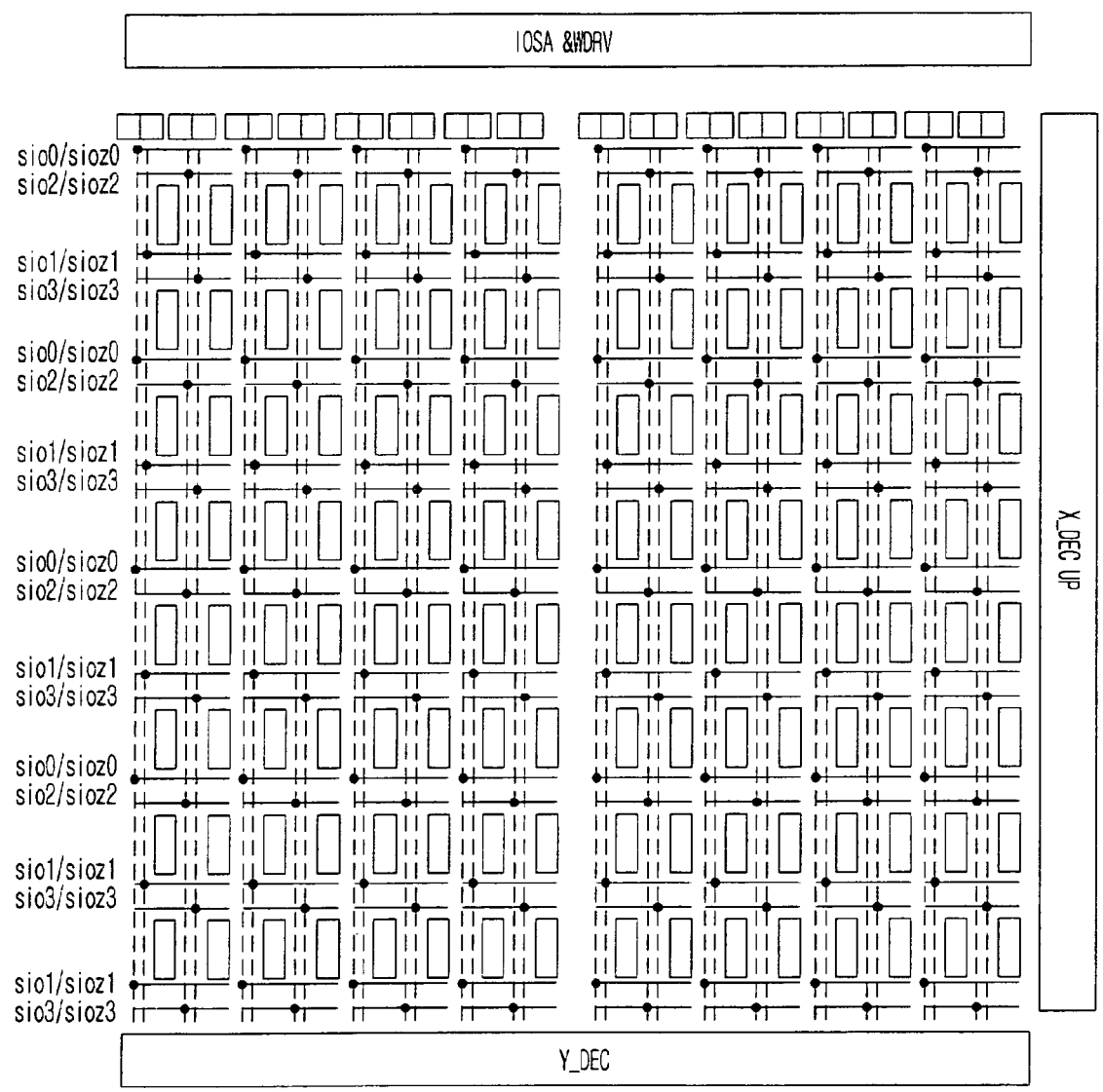
FIG. 5 is a block diagram describing a structure of each bank shown in FIG. 4.

FIG. 4 is a block diagram showing a chip architecture of a DDR SDRAM in accordance with another embodiment of the present invention. Herein, a graphic DDR SDRAM capable of storing 4 M byte and having an X32 data width is described as the DDR SDRAM. FIG. 5 is a block diagram describing a structure of each bank shown in FIG. 4.

Referring to FIGS. 4 and 5, the DDR SDRAM is similar to said DDR SDRAM shown in FIG. 2. Herein, each bank has only one of cell up block and cell down block coupled to I/O sense amplifier via 16 local I/O lines; thus, when a row address is inputted, only one wordline is activated.

As compared with FIG. 2, a DDR SDRAM according to an embodiment of the present invention can easily change a specification including a size, by adjusting an internal structure of the memory cell array without a modification of control blocks and layout. That is, the chip architecture according to an embodiment of the present invention can develop a cutdown product more easily than a conventional chip architecture does.

Figure 6:
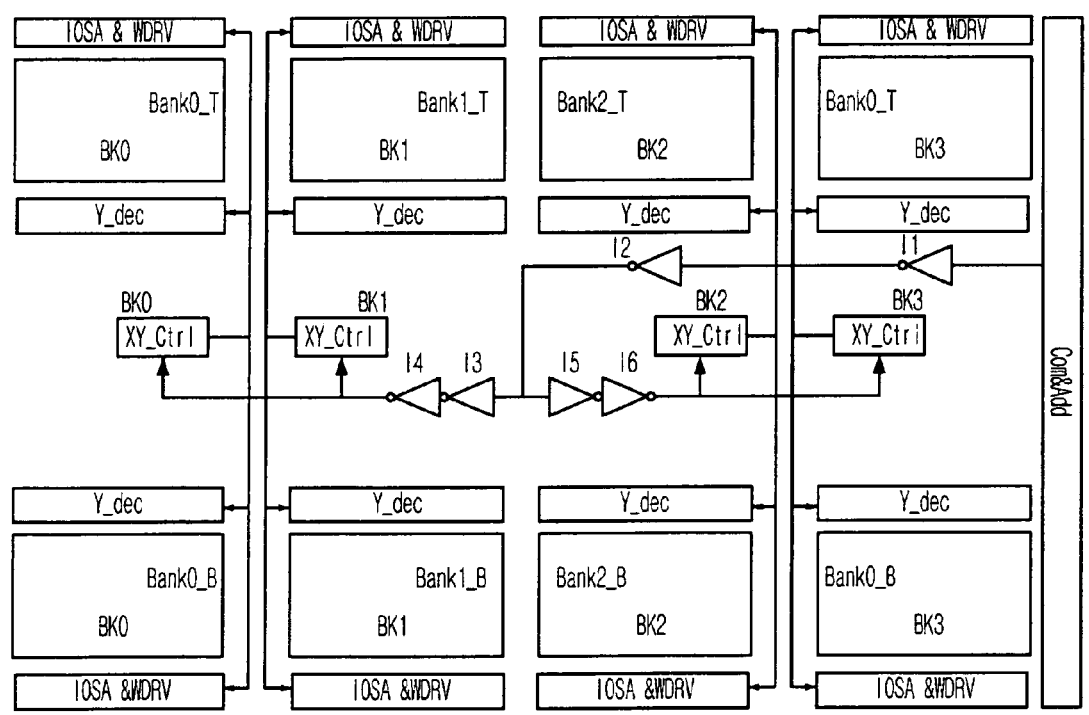
FIG. 6 is a block diagram depicting a path for transmitting a control signal and an address signal from a plurality of command and address pads to a decoding control block corresponding to each bank.

FIG. 6 is a block diagram depicting a path for transmitting a control signal and an address signal from the plurality of command and address pads Com&Add to the decoding control block X,Y_ctrl corresponding to each bank.

Conventionally, since the plurality of command and address pads is located in one side of the chip, control signals corresponding to each bank have different activation timings based on a delay time. That is, the closer a distance between the bank and the plurality of command and address pads is, the faster a control signal for performing a data access corresponding to the bank is activated. On the contrary, if the distance between the bank and the plurality of command and address pads is longer, the control signal is activated later.

A difference of bank access time described above causes a difference of transition timing about data transferred via a global I/O line. Generally, in a high-speed operation, data loaded on the global I/O line are transmitted every clock cycle 1tCK. If there is a difference of data transition timing at the global I/O line, a timing margin for a high-speed operation of the DDR SDRAM is reduced. Thus, for synchronizing data I/O timings of all banks, the delay unit such as an inverter chain should be used. However, in above described scheme, there is limitation for a high-speed operation of the DDR SDRAM because a delay value of the delay unit changes based on a PVT condition (herein, PVT means a process, a voltage and a temperature).

Referring to FIG. 6, instead of the delay unit applying different delays to each bank, first and second repeaters are used in a path between the plurality of command and address pads Com&Add and the decoding control block X,Y_ctrl. In detail, inputted command and address are transmitted from the plurality of command and address pads Com&Add to a center of the chip through the first repeater I1 and I2; and the inputted command and address are transmitted from the center to each decoding control blocks X,Y_ctrl via the second repeater I3 to I4 and I5 to I6. That is, by using the first and second repeaters, the inputted command and address can access the banks in a substantially identical timing regardless of a bank's location, i.e., distance between each bank and the plurality of command and address pads Com&Add.

As above described, in a DDR SDRAM according to an embodiment of the present invention, data loaded on the global I/O line after being outputted from each bank have substantially identical transition timings. In addition, the delay unit such as an inverter chain that is differently applied to each bank in a conventional DDR SDRAM is not required; as a result, errors such as a variation of clock cycle tCK according to the PVT condition are reduced.

Figure 7:
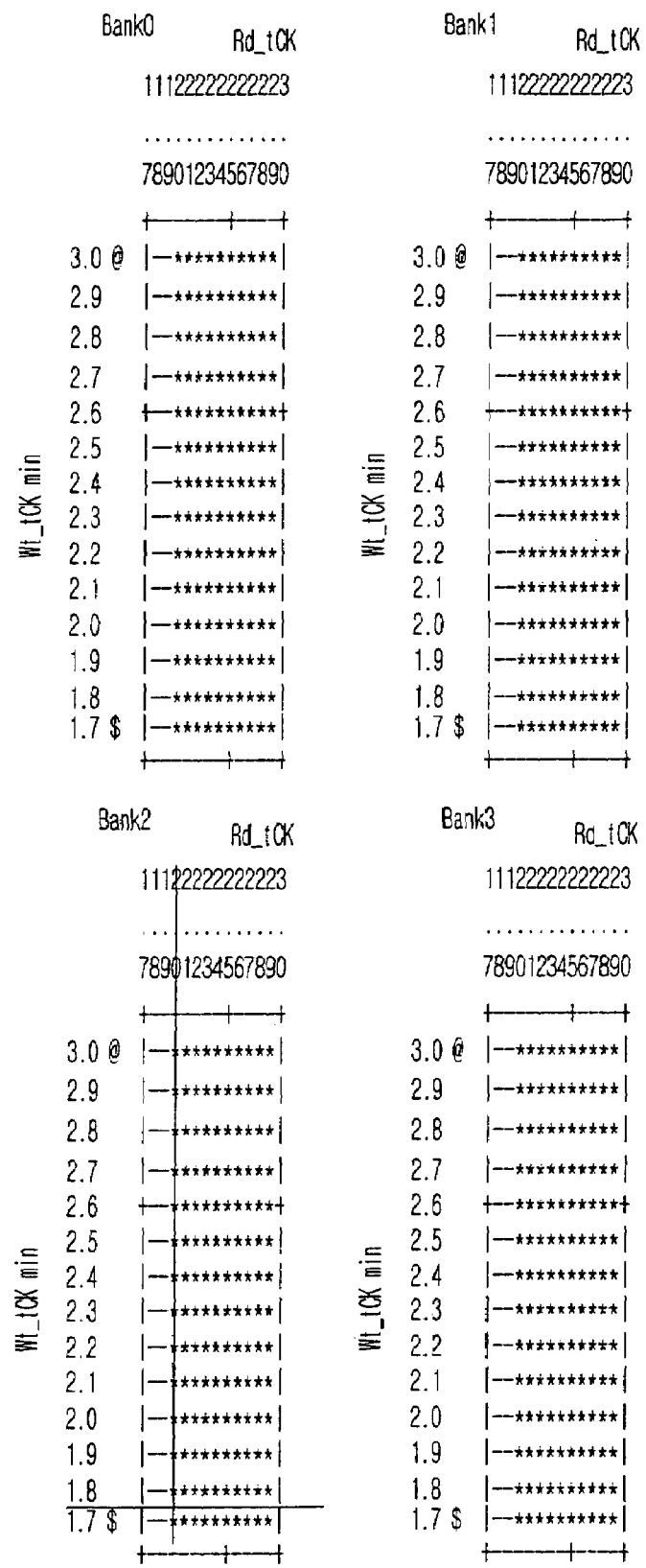
FIG. 7 is a measurement result demonstrating a write operation and a read operation at high speed, in the DDR SDRAM shown in FIG. 6.

FIG. 7 shows measurement results demonstrating a write operation and a read operation at high-speed in the DDR SDRAM shown in FIG. 6. Herein, a symbol 'Wt_tCKmin' means a minimum value of a clock cycle under the write operation; and a symbol 'Rd_tCK' means the clock cycle under the read operation.

As shown, a case is described where control and address signals for accessing a third bank Bank2 have an activation time faster than any other, and other signals for accessing a first, a second and a fourth banks Bank0, Bank1 and Bank3 have a substantially identical activation time respectively. Further, in the third bank Bank2 where the faster control and address signals are inputted based on operation method according to the present invention, a minimum value 'Rd_tCKmin' under the read operation is about 1.9 ns and a minimum value 'Wd_tCKmin' under the write operation is about 1.8 ns. As compared with other banks Bank0, Bank1 and Bank3, a time difference between the third bank Bank2 and other banks is only about 0.1 ns. Therefore, it is supported that the chip architecture shown in FIG. 6 can overcome a difference in bank access timing under high-speed operation of the DDR SDRAM.

Finally, if a same time bank access (STBA) scheme shown in FIG. 6 is applied to two embodiments of the present invention described in FIGS. 2 and 4, the DDR SDRAM according to the present invention can operate at high-frequency. Further, the STBA scheme can be applied to not only a graphic DDR SDRAM but also other semiconductor memory devices.

A semiconductor memory device according to an embodiment of the present invention can reduce a chip size; and, as a result, improve a characteristic of mass production. Also, a semiconductor memory device according to an embodiment of the present invention can operate appropriately. Further, by arranging control blocks for performing a data access in order to achieve an easy modification, other products having substantially identical characteristics and a different cell density can be developed quickly, based on a developed product.

The present application contains subject matter related to the Korean patent application No. KR 2005-0027401, filed in the Korean Patent Office on Mar. 31, 2005, the entire contents of which being incorporated herein by reference. While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device comprising:
   at least one data transmission block including data I/O pads arranged in a major-axis side of the semiconductor memory device;
   a command and address transmission block including address and command input pads arranged in at least one minor-axis side of the semiconductor memory device;
   a global line block, arranged in a center of the semiconductor memory device, for transmitting inputted command and address;
   at least one bank area, arranged between the global line block and the data transmission block, each bank area containing a plurality of banks, a plurality of data I/O blocks located closer to the data transmission block than the global line blocks—and a plurality of control blocks located closer to the global line block than the data transmission block; and
   decoding control blocks corresponding to the plurality of banks, respectively,
   wherein the inputted command and address are transmitted to the decoding control blocks via the center of the semiconductor memory device.

2. The semiconductor memory device as recited in claim 1, wherein the data I/O block includes an I/O sense amplifier and a write driver.

3. The semiconductor memory device as recited in claim 2, wherein the control block includes a column decoder.

4. The semiconductor memory device as recited in claim 3, wherein the data I/O block and the control block included in the bank area corresponds to each of the plurality of banks included in the bank area.

5. The semiconductor memory device as recited in claim 4, wherein the bank area further includes a plurality of row decoders, arranged between and corresponding to the plurality of banks, respectively.

6. The semiconductor memory device as recited in claim 5, wherein the semiconductor memory device includes two bank areas, each having four banks.

7. The semiconductor memory device as recited in claim 6, wherein the semiconductor memory device includes two data transmission blocks, each data transmission block including a half of data I/O pads corresponding to a data bandwidth of the semiconductor memory device.

8. The semiconductor memory device as recited in claim 5, wherein the decoding control block controls the column decoder and the row decoder of a bank based on the inputted command and address via the command and address transmission block.

9. The semiconductor memory device as recited in claim 8, wherein the decoding control block is arranged in the global line block.

10. The semiconductor memory device as recited in claim 1, further comprising:
   a first transmitter for transmitting internal addresses and commands based on the inputted address and command from the command and address transmission block to a center of the global line block; and
   a second transmitter for delivering the internal addresses and commands transmitted to the global line block to the decoding control blocks.

* * * * *

UNITED STATES PATENT AND TRADEMARK OFFICE
CERTIFICATE OF CORRECTION

| | |
|---|---|
| PATENT NO. | : 7,495,991 B2 |
| APPLICATION NO. | : 11/999465 |
| DATED | : February 24, 2009 |
| INVENTOR(S) | : Lee et al. |

It is certified that error appears in the above-identified patent and that said Letters Patent is hereby corrected as shown below:

Title page in Item [56], under foreign patent documents, please insert -- JP 2002-21177 01-21-2000 Fujitsu Ltd. --.

Signed and Sealed this

Twenty-sixth Day of May, 2009

JOHN DOLL
*Acting Director of the United States Patent and Trademark Office*